(12) United States Patent
Thiruvengadam et al.

(10) Patent No.: US 11,036,631 B2
(45) Date of Patent: Jun. 15, 2021

(54) CONFIGURABLE TRIM SETTINGS ON A MEMORY DEVICE

(71) Applicant: Micron Technology, Inc., Boise, ID (US)

(72) Inventors: Aswin Thiruvengadam, Folsom, CA (US); Daniel L. Lowrance, El Dorado Hills, CA (US); Peter Feeley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/802,551

(22) Filed: Nov. 3, 2017

(65) Prior Publication Data

US 2019/0138442 A1     May 9, 2019

(51) Int. Cl.
| | | |
|---|---|---|
| *G06F 12/02* | (2006.01) | |
| *G11C 16/20* | (2006.01) | |
| *G11C 16/32* | (2006.01) | |
| *G11C 11/406* | (2006.01) | |
| *G11C 16/34* | (2006.01) | |
| *G06F 13/16* | (2006.01) | |
| *G06F 16/18* | (2019.01) | |
| *G11C 7/20* | (2006.01) | |
| *G11C 29/26* | (2006.01) | |
| *G11C 29/02* | (2006.01) | |
| *G11C 29/04* | (2006.01) | |

(52) U.S. Cl.
CPC ...... *G06F 12/0292* (2013.01); *G06F 12/0246* (2013.01); *G06F 13/1694* (2013.01); *G06F 16/1847* (2019.01); *G11C 7/20* (2013.01); *G11C 11/40607* (2013.01); *G11C 16/20* (2013.01); *G11C 16/32* (2013.01); *G11C 16/3459* (2013.01); *G11C 29/028* (2013.01); *G11C 29/26* (2013.01); *G06F 2212/7208* (2013.01); *G06F 2212/7209* (2013.01); *G11C 2029/0409* (2013.01); *G11C 2211/5641* (2013.01)

(58) Field of Classification Search
CPC ............ G06F 12/0292; G06F 12/0246; G11C 11/40607; G11C 16/20
USPC ...................................... 365/230.1
See application file for complete search history.

(56) References Cited

U.S. PATENT DOCUMENTS

| | | |
|---|---|---|
| 2009/0109756 A1 | 4/2009 | Kritome |
| 2009/0296471 A1 | 12/2009 | Goda et al. |
| 2010/0110786 A1* | 5/2010 | Kang ................. G11C 16/0483 365/185.2 |
| 2010/0214862 A1 | 8/2010 | Kim et al. |
| 2011/0110164 A1* | 5/2011 | Jeong .................... G11C 29/02 365/189.02 |
| 2012/0230109 A1 | 9/2012 | Tsai et al. |

(Continued)

OTHER PUBLICATIONS

International Search Report and Written Opinion from related international application No. PCT/US2018/058860, dated Feb. 21, 2019, 13 pp.

*Primary Examiner* — Anthan Tran
(74) *Attorney, Agent, or Firm* — Brooks, Cameron & Huebsch, PLLC

(57) ABSTRACT

The present disclosure includes apparatuses and methods related to configurable trim settings on a memory device. An example apparatus can include configuring a set of trim settings for an array of memory cells such that the array of memory cells have desired operational characteristics in response to being operated with the set of trim settings.

24 Claims, 3 Drawing Sheets

(56) References Cited

U.S. PATENT DOCUMENTS

| | | |
|---|---|---|
| 2012/0239858 A1* | 9/2012 | Melik-Martirosian ...................... G11C 16/12 711/103 |
| 2013/0132650 A1* | 5/2013 | Choi ..................... G06F 3/0679 711/103 |
| 2013/0275660 A1 | 10/2013 | Bennett |
| 2013/0311717 A1 | 11/2013 | Kim et al. |
| 2014/0160869 A1 | 6/2014 | He et al. |
| 2014/0181426 A1* | 6/2014 | Grunzke ................ G11C 16/06 711/154 |
| 2015/0092469 A1 | 4/2015 | Kim et al. |
| 2015/0234603 A1 | 8/2015 | Kitagawa et al. |
| 2016/0117112 A1 | 4/2016 | Tomlin |
| 2016/0179406 A1* | 6/2016 | Gorobets ............ G11C 11/5628 711/103 |
| 2016/0217858 A1* | 7/2016 | Navon ................. G11C 29/021 |
| 2017/0160989 A1 | 6/2017 | Hsieh et al. |

* cited by examiner

| | TRIM SETTING 1 ⟵309-1 | TRIM SETTING 2 ⟵309-2 | ... | TRIM SETTING N ⟵309-N |
|---|---|---|---|---|
| 370 — PROGRAMMING SIGNAL MAGNITUDE | LEVEL 2 | LEVEL 3 | ... | LEVEL 1 |
| 371 — SENSING SIGNAL MAGNITUDE | LEVEL 2 | LEVEL 3 | ... | LEVEL 1 |
| 372 — ERASE SIGNAL MAGNITUDE | LEVEL 2 | LEVEL 3 | ... | LEVEL 1 |
| 373 — PROGRAMMING SIGNAL LENGTH | LEVEL 2 | LEVEL 3 | ... | LEVEL 1 |
| 374 — ERASE SIGNAL LENGTH | LEVEL 2 | LEVEL 3 | ... | LEVEL 1 |
| 375 — SENSING SIGNAL LENGTH | LEVEL 2 | LEVEL 3 | ... | LEVEL 1 |
| 376 — NUMBER OF BITS PER CELL | 1 | 3 | ... | 3 |
| 377 — NUMBER OF PROGRAMMING SIGNALS IN A PROGRAMMING OPERATION | 1 | 3 | ... | 1 |
| 378 — NUMBER OF SENSING SIGNALS IN A SENSING OPERATION | 1 | 1 | ... | 1 |
| 379 — ALLOWABLE PROGRAMMING OPERATION RATE | 100 / MIN | 20 / MIN | ... | 500 / MIN |

*Fig. 3*

CONFIGURABLE TRIM SETTINGS ON A MEMORY DEVICE

TECHNICAL FIELD

The present disclosure relates generally to memory systems, and more particularly, to apparatuses and methods with configurable trim settings on a memory device.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), and resistance variable memory such as phase change random access memory (PCRAM), resistive random access memory (RRAM), magnetic random access memory (MRAM), and programmable conductive memory, among others.

Memory devices can be utilized as volatile and non-volatile memory for a wide range of electronic applications in need of high memory densities, high reliability, and low power consumption. Non-volatile memory may be used in, for example, personal computers, portable memory sticks, solid state drives (SSDs), digital cameras, cellular telephones, portable music players such as MP3 players, and movie players, among other electronic devices.

Resistance variable memory devices can include resistive memory cells that can store data based on the resistance state of a storage element (e.g., a resistive memory element having a variable resistance). As such, resistive memory cells can be programmed to store data corresponding to a target data state by varying the resistance level of the resistive memory element. Resistive memory cells can be programmed to a target data state (e.g., corresponding to a particular resistance state) by applying sources of an electrical field or energy, such as positive or negative electrical pulses (e.g., positive or negative voltage or current pulses) to the cells (e.g., to the resistive memory element of the cells) for a particular duration. A state of a resistive memory cell can be determined by sensing current through the cell responsive to an applied interrogation voltage. The sensed current, which varies based on the resistance level of the cell, can indicate the state of the cell.

One of a number of data states (e.g., resistance states) can be set for a resistive memory cell. For example, a single level memory cell (SLC) can be programmed to a targeted one of two different data states, which can be represented by the binary units 1 or 0 and can depend on whether the cell is programmed to a resistance above or below a particular level. As an additional example, some resistive memory cells can be programmed to a targeted one of more than two data states (e.g., 1111, 0111, 0011, 1011, 1001, 0001, 0101, 1101, 1100, 0100, 0000, 1000, 1010, 0010, 0110, and 1110). Such cells may be referred to as multi state memory cells, multiunit cells, or multilevel cells (MLCs). MLCs can provide higher density memories without increasing the number of memory cells since each cell can represent more than one digit (e.g., more than one bit).

BRIEF DESCRIPTION OF THE DRAWINGS

FIG. 3 is a diagram including a table illustrating a number of trim setting configurations for a memory device in accordance with a number of embodiments of the present disclosure.

DETAILED DESCRIPTION

Figure 1:
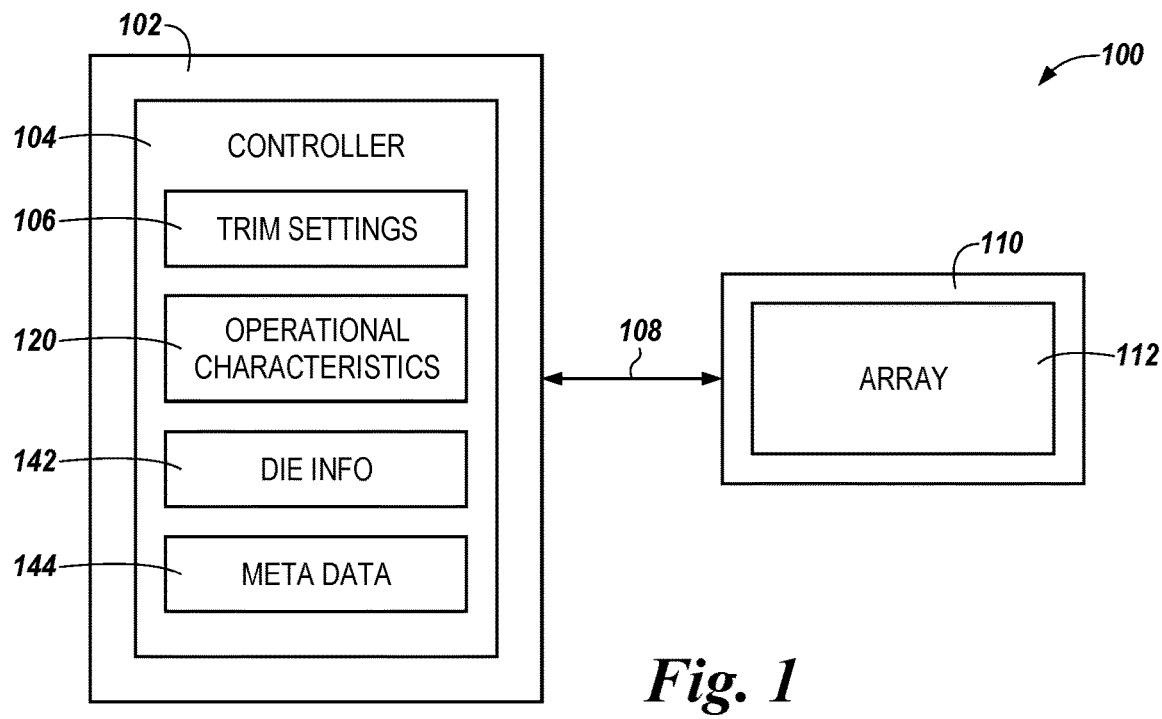
FIG. 1 is a block diagram of a system including an apparatus in the form of a computing device and an apparatus in the form of a memory device in accordance with one or more embodiments of the present disclosure.

The present disclosure includes apparatuses and methods related to configurable trim settings on a memory device. An example apparatus can include configuring a set of trim settings for an array of memory cells such that the array of memory cells have desired operational characteristics in response to being operated with the set of trim settings.

In a number of embodiments, the operational characteristics of a memory device can be monitored and the monitor operational characterizes of a memory device can be used to determine a set of trim settings for the memory device. The set of trim settings (e.g., trim setting configuration) can be based on the monitored operation characteristics of the memory device, desired operational characteristics of the memory device, die information for the arrays of memory cells in the memory device, and/or metadata of the data stored on the memory device.

The set of trim settings determined by the controller can change the operational characteristics of the memory device. For example, the set of trim settings determined by the controller change the operational characteristics of the memory device from the monitored operational characteristics to desired (e.g., target) operational characteristics.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "M", "N", and "X", particularly with respect to reference numerals in the drawings, indicates that a number of the particular feature so designated can be included. As used herein, "a number of" a particular thing can refer to one or more of such things (e.g., a number of memory devices can refer to one or more memory devices).

The figures herein follow a numbering convention in which the first digit or digits correspond to the drawing figure number and the remaining digits identify an element or component in the drawing. Similar elements or components between different figures may be identified by the use of similar digits. For example, 120 may reference element "20" in FIG. 1, and a similar element may be referenced as 220 in FIG. 2. As will be appreciated, elements shown in the various embodiments herein can be added, exchanged, and/or eliminated so as to provide a number of additional embodiments of the present disclosure.

FIG. 1 is a block diagram of a system 100 including an apparatus in the form of a computing device 102 and an apparatus in the form of a memory device 110 in accordance with one or more embodiments of the present disclosure. As used herein, an "apparatus" can refer to, but is not limited to, any of a variety of structures or combinations of structures, such as a circuit or circuitry, a die or dice, a module or modules, a device or devices, or a system or systems, for example. In the embodiment illustrated in FIG. 1, system 102 can include a computing device 102, with controller 104, and memory device 110. The computing device 102 and the memory device 110 can communicate via communication channel 108. Memory device 110 can include array 112, which can include volatile memory and/or non-volatile memory.

Controller 104 and/or a controller on memory device 110 can include control circuitry, e.g., hardware, firmware, and/or software. In one or more embodiments, controller 104 and/or a controller on memory device 110 can be an application specific integrated circuit (ASIC) coupled to a printed circuit board including a physical interface.

Memory device 110 can provide main memory for the system 100 or could be used as additional memory or storage throughout the system 100. System 100 can include memory device 110 and/or a number of memory devices, where each memory device can include one or more arrays of memory cells 112, e.g., non-volatile and/or volatile memory cells. The arrays can be flash arrays with a NAND architecture, for example. Embodiments are not limited to a particular type of memory device. For instance, the memory device can include RAM, ROM, DRAM, SDRAM, PCRAM, RRAM, and/or flash memory, among others.

The embodiment of FIG. 1 can include additional circuitry that is not illustrated so as not to obscure embodiments of the present disclosure. For example, the system 100 can include address circuitry to latch address signals provided over I/O connections through I/O circuitry. Address signals can be received and decoded by a row decoder and a column decoder to access the memory device 110. It will be appreciated by those skilled in the art that the number of address input connections can depend on the density and architecture of the memory device 110.

In a number of embodiments, trims that control the performance of the memory device 110 are located on the memory device 110. Controller 104 can include registers, buffers, and/or memory to store trim settings 106 that define the trims for the data in the memory device 110, operational characteristics 120 of the memory device 110, die info 142 for the array 112, and metadata 144 for the data in memory device 110. Trim settings 106, operational characteristics 120, die info 142, and/or metadata 144 can also be stored in the memory device 110. Trim settings 106 can include a number of parameters that can control the operation and performance of the memory device. For example, the trim settings can include parameters such as the programming signal magnitude (e.g., voltage and/or current level), erase signal magnitude (e.g., voltage and/or current level), sensing signal magnitude (e.g., voltage and/or current level), programming signal length, erase signal length, sensing signal length, number of bits per cells, number of programming signals in a programming operation, number of sensing signals in a sensing operation, and/or allowable programming operation rate for a memory device. Trim settings can include a number of settings for each of the number of parameters.

The trim settings can control the operational characteristics of the memory device 110. The operational characteristics of the memory device can include life span of the memory device 110, data retention characteristics for the data in the memory device 110, the storage density (e.g., the number of bits stored) for the memory device 110, disturb characteristics for the data in the memory device 110, programming speed for the memory device 110, power consumption for the memory device 110, sensing speed for the memory device 110, operation temperature for the memory device 110, and/or programming operation rate for the memory device 110, among other operational characteristics. The memory device 110 can be monitored by the controller 104 and the operational characteristics 120 of the memory device 110 stored on controller 104 can include the monitored operation characteristics. Also, the operational characteristics 120 stored on controller 104 can include desired operational characteristics. Desired operational characteristic can be input to the controller 104 from a host and/or be determined by controller 104 based on the monitored operational characteristics of memory device 110.

In a number of embodiments, trim settings 106 can include a number of configurations of trim setting parameters that can control the operational characteristics of the memory device 110. A trim setting configuration can include setting each of the number of trim setting parameters at particular levels to provide particular operational characteristics for memory device 110. A particular trim setting configuration can be associated with particular operational characteristics for a memory device. A trim setting configuration used to operate memory device 110 can be based on monitored and/or desired operational characteristics 120 for memory device 110, die info 142 for the array 112, and/or metadata 144 for the data in memory device 110.

Trim settings 106 on controller 104 can include a look up table that includes a number of trim setting configurations. Also, trim settings 106 in controller 104 can include trim setting configurations determined by performing an algorithm that calculates trim setting configurations for memory device 110 based on monitored and/or desired operational characteristics 120 for memory device 110, die info 142 for the array 112, and/or metadata 144 for the data in memory device 110. A particular trim setting configuration of the number of trim setting configurations in trim settings 106 can be sent to memory device 110 and used by memory device 110 during operation to provide operational characteristics for memory device 110 associated with the particular trim setting configuration.

A trim setting configuration used by memory device 110 can control the operational characteristics of memory device 110 such that memory device 110 can perform with desired operational characteristics and/or closer to the desired operational characteristics than prior operational characteristics of memory device 110.

The operational characteristics of memory device 110 can be controlled by the trim setting parameters in trims settings 106. For example, the operational characteristic of life span for memory device 110 can be dependent on trim setting parameters such as the allowable programming operation rate and programming signal magnitude, for example. The life span of memory device 110 can be dependent on the allowable programming operation rate (e.g., the number of programming operations performed over a period of time) and the programming signal magnitude because a memory device has a finite number of times the memory cells of the memory device can be programmed before the memory cells fail, which in turn can be dependent on the magnitude of the programming signal used to program the memory cells. Therefore, the trim setting parameters for memory device 110 can include setting the allowable programming operation rate at a particular number of programming operations per minute to allow the memory device to have a particular life span based on prior operational characteristics of the memory device, prior trim setting configurations used by the memory device, and/or desired operational characteristics of the memory device.

Figure 2:
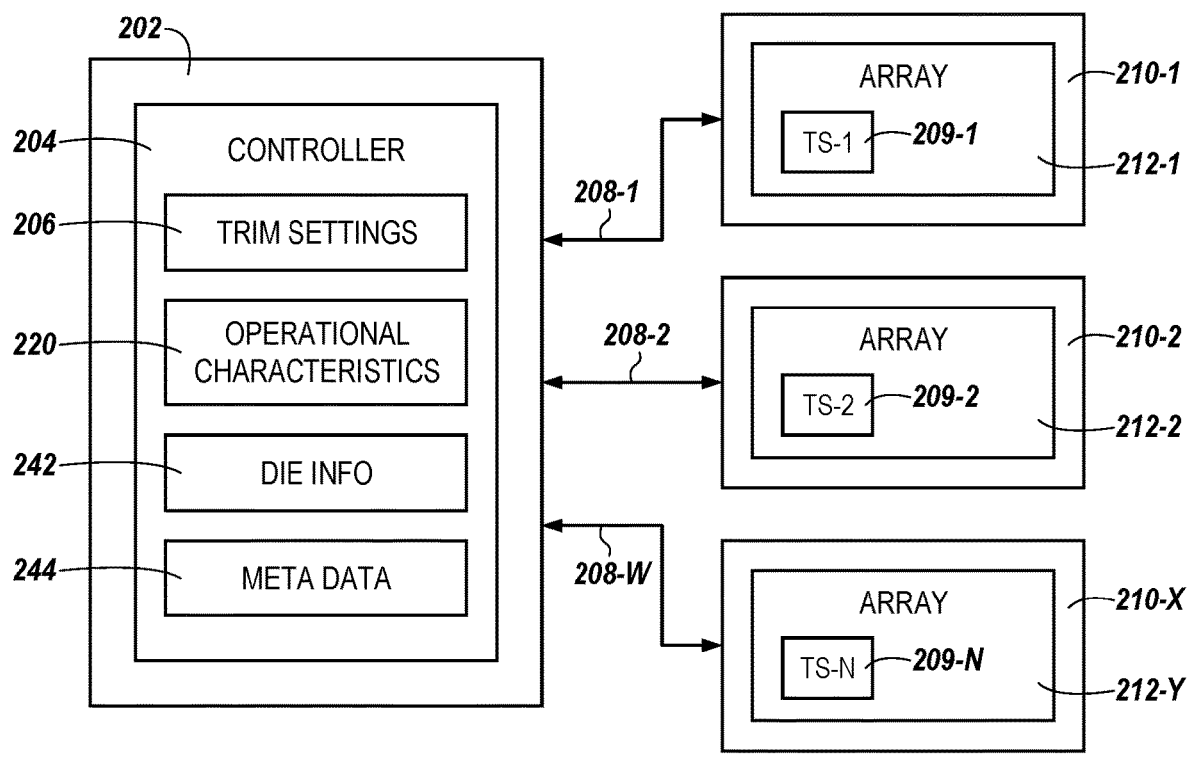
FIG. 2 is a block diagram of a system including an apparatus in the form of a computing device and a number of apparatuses in the form of memory devices in accordance with a number of embodiments of the present disclosure.

FIG. 2 is a block diagram of a system including an apparatus in the form of a computing device and a number of apparatuses in the form of memory devices in accordance with a number of embodiments of the present disclosure. Computing device 202, with controller 204, can communicate with memory device 210-1 via communication channel 208-1, memory device 210-2 via communication channel 208-2, and memory device 210-X via communication channel 208-W. Memory device can include memory array 212-1, memory device 210-2 can include memory array 212-2, and memory device 210-X can include memory array 212-Y. Memory devices 210-1, 210-2, and 210-X can include any number of memory arrays of any type of memory, such as volatile and/or non-volatile memory.

Controller 204 can include buffers, registers, and or memory to store trim settings 206 for memory devices 210-1, 210-2, and 210-X. Trim settings 206 can be configured by controller 204 based on the operational characteristics 206 memory devices 210-1, 210-2, and 210-X, the die information 242 of the arrays on of memory devices 210-1, 210-2, and 210-X, and/or the metadata for data stored on memory devices 210-1, 210-2, and 210-X. The die information 242 can include manufacturing data about the memory devices 210-1, 210-2, and 210-X, such as portions of the arrays that may be more suited for particular types of data and/or portions of the array that are less reliable. The metadata 244 for the data stored on memory devices 210-1, 210-2, and 210-X can include information such as whether the data on the memory devices is hot or cold (e.g., whether the data has been recently updated or whether the data has been on the memory device for a particular period of time).

The controller 204 can monitor memory devices 210-1, 210-2, and 210-X to determine the operational characteristics of the memory devices 210-1, 210-2, and 210-X. Also, memory devices 210-1, 210-2, and 210-X can send operational characteristics to the controller 204.

Controller 204 can send initial trim setting configurations to memory devices 210-1, 210-2, and 210-X and memory devices 210-1, 210-2, and 210-X can operate using those initial trim setting configurations. Controller can monitor memory devices 210-1, 210-2, and 210-X to determine the operational characteristics of memory devices 210-1, 210-2, and 210-X and, in turn, configure and determine new trim setting configurations using mathematical models and/or error-reducing feedback algorithms that can be used to change the operational characteristics of memory devices 210-1, 210-2, and 210-X.

Controller 204 can configure the trim settings so that memory devices 210-1, 210-2, and 210-X will operate with desired operational characteristics or change their operational characteristics to be closer to the desired operational characteristics. The desired operational characteristics 220 can be based upon the type of data stored on memory devices 210-1, 210-2, and 210-X and/or the environment where memory devices 210-1, 210-2, and 210-X. The desired operational characteristics 220 can be determined by controller 204 based on monitored operational characteristics 220 and/or based on input from a host.

In FIG. 2, trim setting 1 (TS-1) 209-1 can be sent to memory device 210-1, trim setting 2 (TS-2) 209-2 can be sent to memory device 209-2, and trim setting N (TS-N) 209-N can be sent to memory device 210-X. Trim setting 1 209-1 can be configured for memory device 209-1 by controller 204 based on prior operational characteristics of memory device 209-1 monitored by controller 204. Trim setting 2 209-2 can be configured for memory device 209-2 by controller 204 based on prior operational characteristics of memory device 209-2 monitored by controller 204. Trim setting N 209-N can be configured for memory device 209-N by controller 204 based on prior operational characteristics of memory device 209-N monitored by controller 204.

FIG. 3 is a diagram including a table illustrating a number of trim setting configurations for a memory device in accordance with a number of embodiments of the present disclosure. In FIG. 3, trim setting configurations 309-1, 309-2, and 309-N can include the trim setting parameters programming signal magnitude 370, sensing signal magnitude 371, erase signal magnitude 372, programming signal length 373, erase signal length 374, sensing signal length 375, number of bits per cell 376, number of programming signals in a programming operation 377, number of sensing signals in a sensing operation 378, and allowable programming operation rate 379. Trim setting configurations 309-1, 309-2, and 309-N can be set by a controller based on monitored and/or desired operational characteristics for a memory device 110, die info for the arrays of memory cells in a memory device, and/or metadata for the data in a memory device. Desired operational characteristics can be based on input from a host and/or monitored operational characteristics for a memory device. Trim setting configurations 309-1, 309-2, and 309-N can be configured and determined by a controller so that a memory device can operate with operational characteristics associated with the particular trim setting configuration.

In FIG. 3, trim setting 1 309-1 can include programming signal magnitude 370 at level 2, sensing signal magnitude 371 at level 2, erase signal magnitude 372 at level 2, programming signal length 373 at level 2, erase signal length 374 at level 2, sensing signal length 375 at level 2, number of bits per cell 376 at 1 bit per memory cell, number of programming signals in a programming operation 377 at 1 programming signal per programming operation, number of sensing signals in a sensing operation 378 at 1 sensing signal per sensing operation, and allowable programming operation rate 379 at 100 programming operations per minute.

Trim setting 1 309-1 can be associated with a memory device that is used to store static and/or dynamic data that can be programmed and sensed in a variety of environments. The programming signal magnitude 370, sensing signal magnitude 371, erase signal magnitude 372, programming signal length 373, erase signal length 374, sensing signal length 375 are all at level 2 such that the signals provide data retention, disturb characteristics, refresh operations, and/or replacement indications for a variety of operation conditions. The number of bits per memory cell is 1 bit per memory cells so the memory cells can be programmed with only 1 programming signal, which can allow memory cells to be programmed quicker and with less power when compared to memory cells programmed with more bits and signals. For example, a controller can send data to a portion of the memory device that is using trim setting 1 309-1 where the data has characteristics that are suited to for operations, such as reading and/or writing the data, using the trim settings of trim setting 1 309-1.

In FIG. 3, trim setting 1 309-2 can include programming signal magnitude 370 at level 3, sensing signal magnitude 371 at level 3, erase signal magnitude 372 at level 3, programming signal length 373 at level 3, erase signal length 374 at level 3, sensing signal length 375 at level 3, number of bits per cell 376 at 3 bits per memory cell, number of programming signals in a programming operation 377 at 3 programming signals per programming operation, number of sensing signals in a sensing operation 378 at 1 sensing signal per sensing operation, and allowable programming operation rate 379 at 20 programming operations per minute.

Trim setting 2 309-2 can be associated with a memory device that is used to store static data that will be stored on the memory device without being updated frequently and can be retained in a variety of environments. The programming signal magnitude 370, sensing signal magnitude 371, erase signal magnitude 372, programming signal length 373, erase signal length 374, sensing signal length 375 are all at level 3 such that the signals provide data retention, disturb characteristics, refresh operations, and/or replacement indications for a variety of more extreme of operation conditions (e.g., temperature variation between programming operations and sensing operations). The number of bits per memory cell is 3 bits per memory cells and the memory cells can be programmed with 3 programming signal, which can allow the data in the memory cells to be stable.

In FIG. 3, trim setting 1 309-N can include programming signal magnitude 370 at level 1, sensing signal magnitude 371 at level 1, erase signal magnitude 372 at level 1, programming signal length 373 at level 1, erase signal length 374 at level 1, sensing signal length 375 at level 1, number of bits per cell 376 at 3 bits per memory cell, number of programming signals in a programming operation 377 at 1 programming signal per programming operation, number of sensing signals in a sensing operation 378 at 1 sensing signal per sensing operation, and allowable programming operation rate 379 at 500 programming operations per minute.

Trim setting N 309-N can be associated with a memory device that is used to store dynamic data that will be stored on the memory device for shorter periods of time and/or be updated frequently. The programming signal magnitude 370, sensing signal magnitude 371, erase signal magnitude 372, programming signal length 373, erase signal length 374, sensing signal length 375 are all at level 1 such that the signals provide programming speed and sensing speed to write and access data more frequently than data that is to be retained for longer periods of time. The number of bits per memory cell is 3 bits per memory cells so the storage capacity of the memory device is higher than storing 1 bit per memory cell and the memory cells can be programmed with 1 programming signal which allows data to be programmed quickly but have reduced data retention characteristics.

Figure 4:
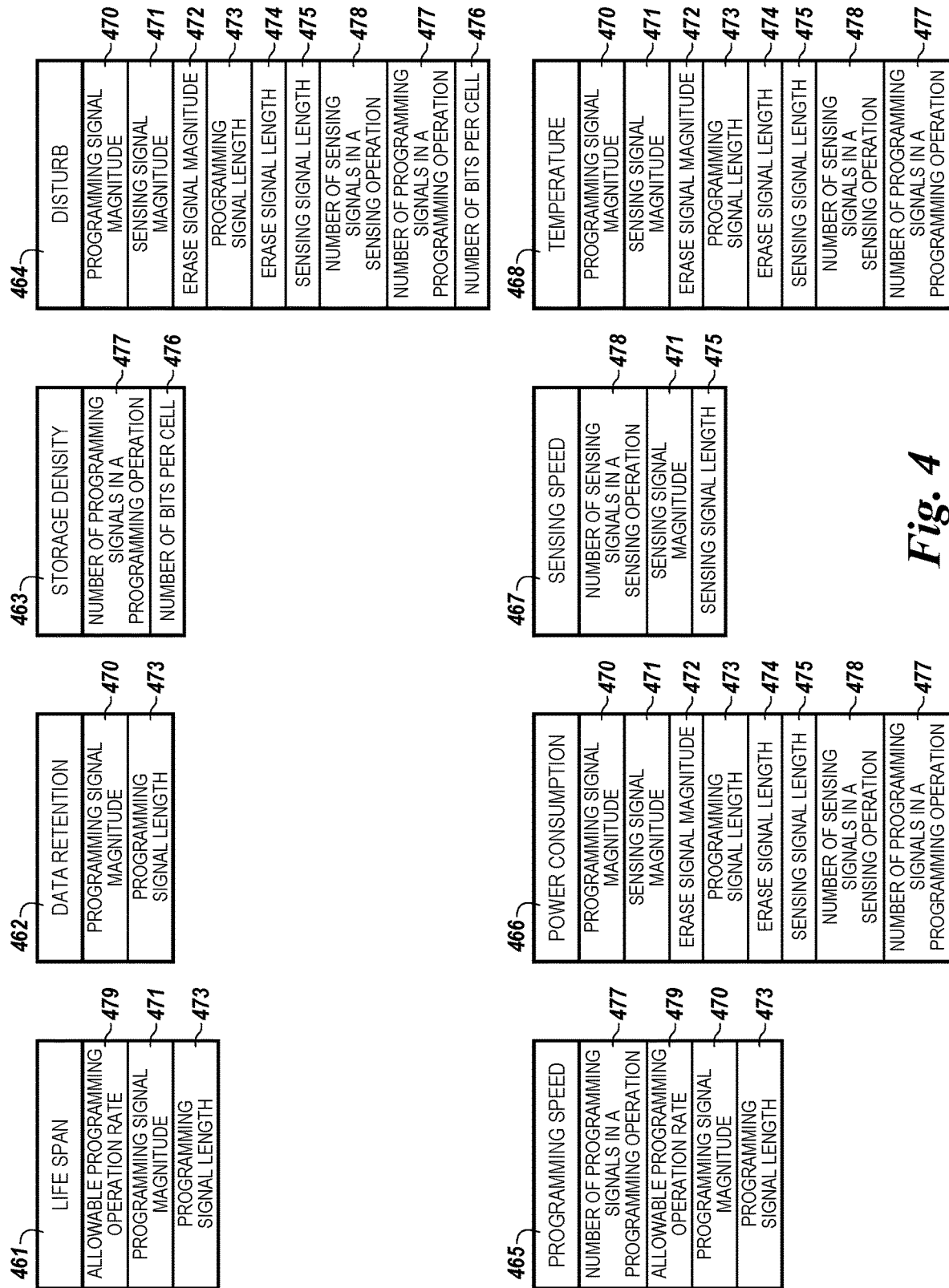
FIG. 4 is a diagram including tables with trim setting parameters associated with operational characteristics of a memory device in accordance with a number of embodiments of the present disclosure.

FIG. 4 is a diagram including tables with trim setting parameters associated with operational characteristics of a memory device in accordance with a number of embodiments of the present disclosure. In FIG. 4, the operational characteristics of a memory device include life span 461, data retention 462, storage density 463, disturb characteristics 464, programming speed 465, power consumption 466, sensing speed 467, and temperature 468. The operational characteristics in FIG. 4, among other operational characteristics, can be affected and/or controlled by trim setting parameters. In FIG. 4, the trim setting parameters associated with operational characteristics of a memory device include programming signal magnitude 470, sensing signal magnitude 471, erase signal magnitude 472, programming signal length 473, erase signal length 474, sensing signal length 475, number of bits per cell 476, number of programming signals in a programming operation 477, number of sensing signals in a sensing operation 478, and allowable programming operation rate 479. Embodiments of the present disclosure are not limited to the trim setting parameters in FIG. 4 and can include other trim setting parameters that are associated with operational characteristics of a memory device.

In FIG. 4, life span 461 of a memory device can be associated with the allowable programming operation rate 479, the programming signal magnitude 471, and programming signal length. Memory cells of memory devices can be programmed a finite number of times before they will fail. The number of times memory cells can be programmed is also associated with the magnitude and duration of the programming signals used to the program the memory cells. Trim setting configurations can include setting an allowable programming operation rate 479, along with the programming signal magnitude 471 and programming signal length to affect the life span 461 of the memory device.

In FIG. 4, data retention 462 in a memory device can be associated with the programming signal magnitude 471 and programming signal length. Data retention 462 in a memory device is the length of time after memory cells are programmed that bits of data stored in memory cells can be read without error. The magnitude of the programming signal and the length that the programming signal is applied to the memory cells can affect the data retention 462 characteristics of a memory device. For example, the voltage of the programming signal can be a particular magnitude such that the memory cell can be read over a period time despite voltage drift and/or disturb affecting reading of the data in the memory cells. Also, the length of the programming signal can be associated ensuring that programming operations are programming memory cells to the desired voltage to have desired data retention characteristics. Trim setting configurations can include setting the programming signal magnitude 471 and programming signal length 473 to affect data retention 462 characteristics in a memory device.

In FIG. 4, storage density 463 of a memory device can be associated with the number of bits per cell 476 and the number of programming signals in a programming operation 477. Storage density 463 of a memory device can include the number of bits stored per memory cell. A first portion of a memory device can store a first number of bits per memory cell and a second portion of a memory device can store a second number of bits per memory cell. Trim setting configurations that include setting the storage density 463 of a memory device can affect the programming speed of a memory device, the amount of data that can be stored on a memory device, and/or the power consumption of memory device, among other operational characteristics of a memory device. A memory device can include trim setting configurations that include the number of bits per memory cell 476 and the number of programming signals in a programming operation 477 to affect the storage density 463 of a memory device.

In FIG. 4, disturb 464 characteristics of a memory device can be associated with programming signal magnitude 470, sensing signal magnitude 471, erase signal magnitude 472, programming signal length 473, erase signal length, 474, sensing signal length 475, number of sensing signals in a sensing operation 478, number of programming signals in a programming operation 477, and number of bits per memory cell 476. Memory cells can be affected by other memory cells in a memory device. For example, the voltage of memory cell and how it was programmed to that voltage can affect the voltage of other memory cells. Also, how memory cells are sense and/or erased can affect the voltage of other memory cells. The effects of memory cells on each other in memory devices can be referred to as disturb characteristics 464 of the memory device due memory cells disturbing other memory cells. A memory device can include trim setting configurations that include the programming signal magnitude 470, the sensing signal magnitude 471, the erase signal magnitude 472, the programming signal length 473, the erase signal length, 474, the sensing signal length 475, the number of sensing signals in a sensing operation 478, the number of programming signals in a programming operation 477, and the number of bits per memory cell 476 of a memory device to affect the disturb 464 characteristics of a memory device.

In FIG. 4, programming speed 465 of a memory device can be associated with the number of programming signals in a programming operation 477, allowable programming operation rate 479, programming signal magnitude 470, and the programming signal length 473. Trim setting configurations that include setting the programming speed 465 of a memory device can affect data retention in a memory device, the life span of a memory device, and/or the power consumption of memory device, among other operational characteristics of a memory device. A memory device can include trim setting configurations that include the number of programming signals in a programming operation 477, the allowable programming operation rate 479, the programming signal magnitude 470, and the programming signal length 473 to affect the programming speed 465 of a memory device.

In FIG. 4, power consumption 466 of a memory device can be associated with programming signal magnitude 470, sensing signal magnitude 471, erase signal magnitude 472, programming signal length 473, erase signal length, 474, sensing signal length 475, number of sensing signals in a sensing operation 478, and number of programming signals in a programming operation 477. Power consumption of 466 of a memory device can be affected by the voltage level that is being used to program, erase, and sense the memory cells, along with the duration and number of signals that are being used to program, erase, and sense the memory cells. A memory device can include trim setting configurations that include the programming signal magnitude 470, the sensing signal magnitude 471, the erase signal magnitude 472, the programming signal length 473, the erase signal length 474, the sensing signal length 475, the number of sensing signals in a sensing operation 478, the number of programming signals in a programming operation 477, of a memory device to affect the power consumption 466 of a memory device.

In FIG. 4, sensing speed 467 of a memory device can be associated with the number of sensing signals in a sensing operation 478, the sensing signal magnitude 471, and the sensing signal length 475. Trim setting configurations that include setting the sensing speed 467 of a memory device can affect the latency associated with performing read operations on a memory device. A memory device can include trim setting configurations that include the number of sensing signals in a sensing operation 478, the sensing signal magnitude 471, and the sensing signal length 475 to affect the sensing speed 467 of a memory device.

In FIG. 4, the temperature 468 of a memory device can be associated with programming signal magnitude 470, sensing signal magnitude 471, erase signal magnitude 472, programming signal length 473, erase signal length, 474, sensing signal length 475, number of sensing signals in a sensing operation 478, and number of programming signals in a programming operation 477. Memory cells can be affected by the temperature of memory device. For example, the temperature of memory device when memory cells are programmed and/or read can affect the signals used to program, erase, and sense the memory cells. Also, temperature of a memory device when data is programmed and/or read can affect data retention characteristics, the programming speed, sensing speed, power consumption, and life span of a memory device. A memory device can include trim setting configurations that include the programming signal magnitude 470, the sensing signal magnitude 471, the erase signal magnitude 472, the programming signal length 473, the erase signal length, 474, the sensing signal length 475, the number of sensing signals in a sensing operation 478, and the number of programming signals in a programming operation 477 of a memory device to account for the temperature 468 of a memory device.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
an array of memory cells; and
a controller, wherein the controller is coupled to the array of memory cells and includes control circuitry configured to:
determine a set of trim settings for the array of memory cells such that the array of memory cells have operational characteristics comprising a desired life span in response to being operated with the determined set of trim settings, wherein the determined set of trim settings are determined by performing an algorithm to calculate a trim setting configuration comprising a number of trim setting parameters including an allowable programming operation rate, a programming signal magnitude, and a programming signal length to change a life span of the array of memory cells from a prior life span of the array of memory cells associated with a prior trim setting configuration having a prior allowable programming operation rate, a prior programming signal magnitude, and a prior programming signal length to the desired life span.

2. The apparatus of claim 1, wherein the desired life span of the array of memory cells are based on prior operations performed on the array of memory cells.

3. The apparatus of claim 1, wherein the prior life span of the array of memory cells is monitored by the controller.

4. The apparatus of claim 1, the set of trim settings are determined based on operational characteristics of the array monitored by the controller.

5. The apparatus of claim 1, wherein the operational characteristics include data retention characteristics for the array of memory cells.

6. The apparatus of claim 1, wherein the operational characteristics include storage density characteristics for the array of memory cells.

7. An apparatus, comprising:
an array of memory cells; and
a controller, wherein the controller is coupled to the array of memory cells and includes control circuitry configured to:
monitor operational characteristics comprising storage density characteristics of the array of memory cells; and
determine a set of trim settings for the array of memory cells by performing an algorithm to calculate a trim setting configuration based on the monitored storage density characteristics of the array of memory cells, wherein the algorithm calculates a number of programming signals in a programming operation and a number of bits per cells for the trim setting configuration for the trim setting configuration and wherein the trim setting configuration of the set of trim settings are calculated to change the storage density characteristics of the array of memory cells from the monitored storage density characteristics associated with a prior trim setting configuration having a prior number of programming signals in a programming operation and a prior number of bits per cells for the trim setting configuration to desired storage density characteristics.

8. The apparatus of claim 7, wherein the controller is configured to operate the array of memory cells using the determined set of trim settings.

9. The apparatus of claim 7, wherein the storage density characteristics are monitored in response to operating the array of memory cells with the determined set of trim settings.

10. A method, comprising:
determining a set of trim settings for a memory device based on operational characteristics comprising data retention characteristics of the memory device by performing an algorithm to calculate a trim setting configuration comprising a programming signal magnitude and a programming signal length for the determined set of trim settings; and
operating the memory device using the trim setting configuration comprising the programming signal magnitude and the programming signal length calculated by the algorithm for the determined set of trim settings, wherein the trim setting configuration of the determined set of trim settings are calculated to change the data retention characteristics of the array of memory cells from prior data retention characteristics associated with a prior trim setting configuration having a prior programming signal magnitude and a prior programming signal length to desired data retention characteristics.

11. The method of claim 10, wherein the method includes monitoring the operational characteristics of the memory device.

12. The method of claim 10, further including determining the set of trim settings based on die information for an array of memory cells in the memory device.

13. The method of claim 10, further including determining the set of trim settings based on metadata for data in the memory device.

14. The method of claim 10, wherein the method includes updating the determined set of trim settings in response to a change in the data retention characteristics of the memory device.

15. A method, comprising:
monitoring operational characteristics of a memory device, wherein the operational characteristics are affected by a number of trim setting parameters comprising a programming signal magnitude, a sensing signal magnitude, an erase signal magnitude, a programming signal length, an erase signal length, a sensing signal length, a number of bits per cell, a number of programming signals in a programming operation, a number of sensing signals in a sensing operation, and an allowable programming operation rate; and
configuring a set of trim settings for the memory device based on the monitored operational characteristics of the memory device, wherein the set of trim settings include the number of trim setting parameters that are determined by performing an algorithm to calculate a trim setting configuration to change the operational characteristics of the memory device from the monitored operational characteristics to desired operational characteristics, wherein the trim setting configuration changes at least one of the programming signal magnitude, the sensing signal magnitude, the erase signal magnitude, the programming signal length, the erase signal length, the sensing signal length, the number of bits per cell, the number of programming signals in the programming operation, the number of sensing signals in the sensing operation, and the allowable programming operation rate and wherein the monitored operational characteristics are based on a prior trim setting configuration that the memory device was using and wherein the trim setting configuration calculated by the algorithm changes at least one trim setting parameter of the prior trim setting configuration.

16. The method of claim 15, wherein configuring the set of trim settings includes changing the number of trim setting parameters associated with a particular operational characteristic of the memory device.

17. The method of claim 15, wherein configuring the set of trim settings includes setting the allowable programming operation rate, the programming signal magnitude, and the programming signal length to manage a life span of the memory device.

18. The method of claim 15, wherein configuring the set of trim settings includes setting the programming signal magnitude and the programming signal length to manage data retention characteristics of the memory device.

19. The method of claim 15, wherein configuring the set of trim settings includes setting the number of bits per memory cell and the number of programming signals in the programming operation to manage storage density of the memory device.

20. The method of claim 15, wherein configuring the set of trim settings includes setting the programming signal magnitude, the sensing signal magnitude, the erase signal magnitude, the programming signal length, the erase signal length, the sensing signal length, the number of sensing signals in the sensing operation, the number of programming signals in the programming operation, and the number of bits per memory cell to manage disturb characteristics of the memory device.

21. The method of claim 15, wherein configuring the set of trim settings includes setting the number of programming signals in a programming operation, the allowable programming operation rate, the programming signal magnitude, and the programming signal length to manage a programming speed of the memory device.

22. The method of claim 15, wherein configuring the set of trim settings includes setting the programming signal magnitude, the sensing signal magnitude, the erase signal magnitude, the programming signal length, the erase signal length, the sensing signal length, the number of sensing signals in the sensing operation, the number of programming signals in the programming operation to manage power consumption of the memory device.

23. The method of claim 15, wherein configuring the set of trim settings includes setting the number of sensing signals in the sensing operation, the sensing signal magnitude, and the sensing signal length to manage a sensing speed of the memory device.

24. The method of claim 15, wherein configuring the set of trim settings includes setting the programming signal magnitude, the sensing signal magnitude, the erase signal magnitude, the programming signal length, the erase signal length, the sensing signal length, the number of sensing signals in the sensing operation, and the number of programming signals in the programming operation device to account for a temperature of the memory device.

\* \* \* \* \*